US00RE39854E

(19) United States
(12) Reissued Patent
Mostafazadeh et al.

(10) Patent Number: US RE39,854 E
(45) Date of Reissued Patent: Sep. 25, 2007

(54) LEAD FRAME CHIP SCALE PACKAGE

(75) Inventors: Shahram Mostafazadeh, San Jose, CA (US); Joseph O. Smith, Morgan Hill, CA (US)

(73) Assignee: National Semiconductor Corporation, Santa Clara, CA (US)

(21) Appl. No.: 10/260,044

(22) Filed: Sep. 27, 2002

Related U.S. Patent Documents

Reissue of:
(64) Patent No.: 6,130,473
Issued: Oct. 10, 2000
Appl. No.: 09/054,422
Filed: Apr. 2, 1998

(51) Int. Cl.
*H01L 23/495* (2006.01)

(52) U.S. Cl. ..... 257/666; 257/676; 257/674; 257/669

(58) Field of Classification Search ..... 257/666, 257/676, 674, 669
See application file for complete search history.

(56) References Cited

U.S. PATENT DOCUMENTS

| | | | |
|---|---|---|---|
| 3,657,805 | A | 4/1972 | Johnson |
| 4,504,435 | A | 3/1985 | Orcutt |
| 4,672,418 | A | 6/1987 | Moran et al. |
| 4,896,418 | A | 1/1990 | Yearsley |
| 4,899,207 | A | 2/1990 | Hallowell et al. |
| 5,122,860 | A | 6/1992 | Kikuchi et al. |
| 5,157,475 | A | 10/1992 | Yamaguchi |
| 5,157,480 | A | 10/1992 | McShane et al. |
| 5,177,591 | A | 1/1993 | Emanuel |
| 5,200,362 | A | 4/1993 | Lin et al. |
| 5,273,938 | A | 12/1993 | Lin et al. |
| 5,294,827 | A | 3/1994 | McShane |
| 5,521,429 | A | 5/1996 | Aono et al. |
| 5,559,364 | A | 9/1996 | Hojyo |
| 5,640,746 | A | 6/1997 | Knecht et al. |
| 5,656,550 | A | 8/1997 | Tsuji et al. |
| 5,663,593 | A | 9/1997 | Mostafazadeh et al. |
| 5,696,033 | A | 12/1997 | Kinsman |
| 5,844,315 | A | 12/1998 | Melton et al. |
| 5,973,388 | A | 10/1999 | Chew et al. |
| 5,977,613 | A | 11/1999 | Takata et al. |
| 6,033,933 | A | 3/2000 | Hur |
| 6,117,710 | A | 9/2000 | Mostafazadeh et al. |
| 6,130,473 | A | 10/2000 | Mostafazadeh et al. |
| 6,143,981 | A | 11/2000 | Glenn |
| 6,190,938 | B1 | 2/2001 | Liu |
| 6,201,292 | B1 | 3/2001 | Yagi et al. |
| 6,215,179 | B1 | 4/2001 | Ohgiyama |
| 6,400,004 | B1 | 6/2002 | Fan et al. |
| 6,424,024 | B1 | 7/2002 | Shih et al. |

*Primary Examiner*—S. V. Clark
(74) *Attorney, Agent, or Firm*—Beyer Weaver LLP

(57) ABSTRACT

A method for producing chip scale IC packages includes the step of mounting a lead frame panel on a temporary support fixture in order to provide support and protection during the manufacturing process. An embodiment of the temporary support fixture includes a sheet of sticky tape secured to a rigid frame. The rigid frame maintains tension in the sheet of sticky tape to provide a stable surface to which the lead frame panel can be affixed. Installation of IC chips and encapsulation in protective casings is performed as in conventional IC package manufacturing. If encapsulant material is to be dispensed over the IC chips, an encapsulant dam can be formed around the lead frame panel to contain the flow of encapsulant material. The temporary support fixture can be used in any IC package manufacturing process in which lead frames require supplemental support.

9 Claims, 6 Drawing Sheets

(Amended)

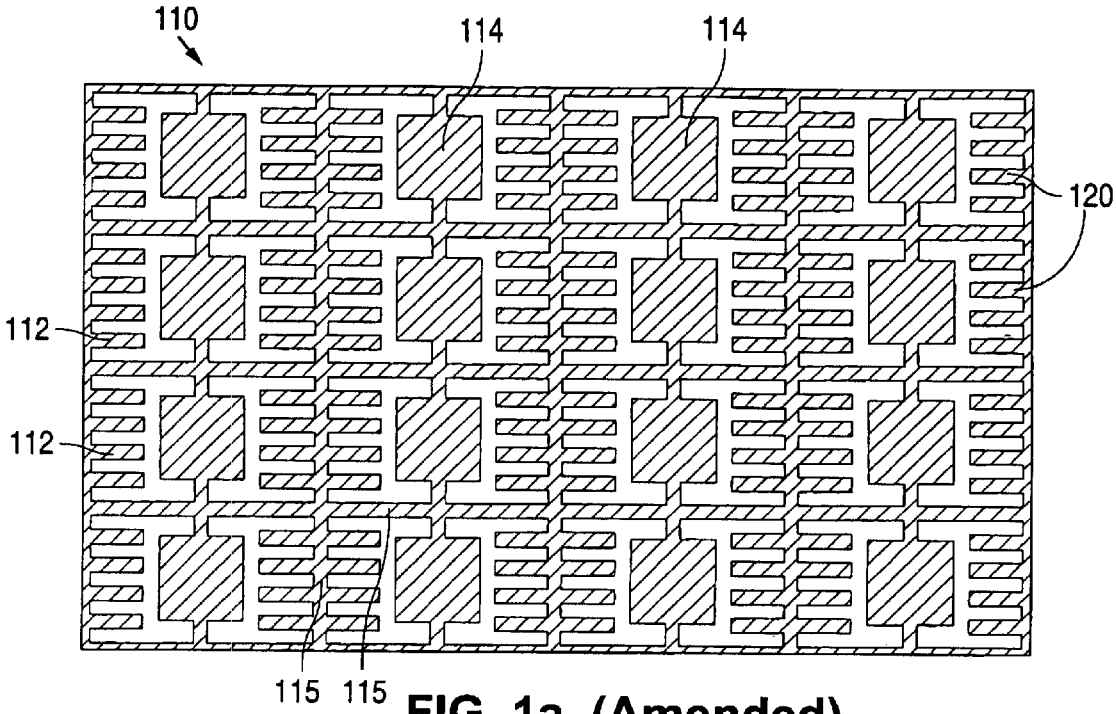
FIG. 1a (Amended)

191 SMALL OUTLINE PACKAGE (SOP)

192 PIN-THROUGH-HOLE (PTH)

191 PLASTIC LEADED CHIP CARRIER (PLCC)

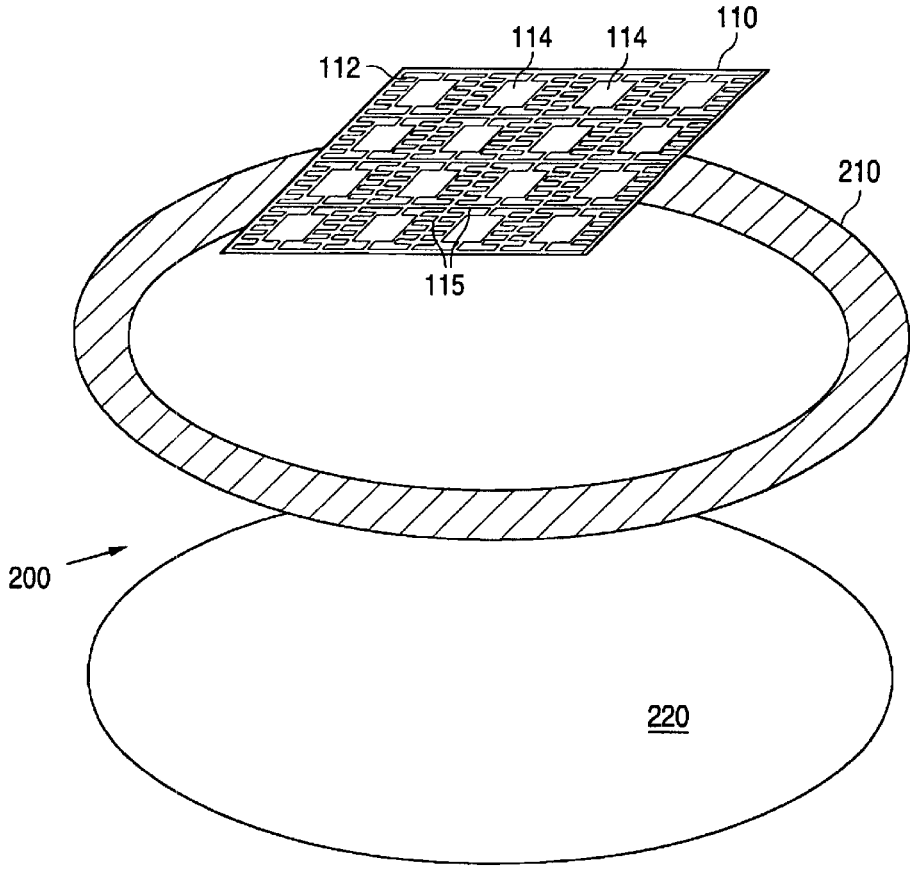
FIG. 2a (Amended)

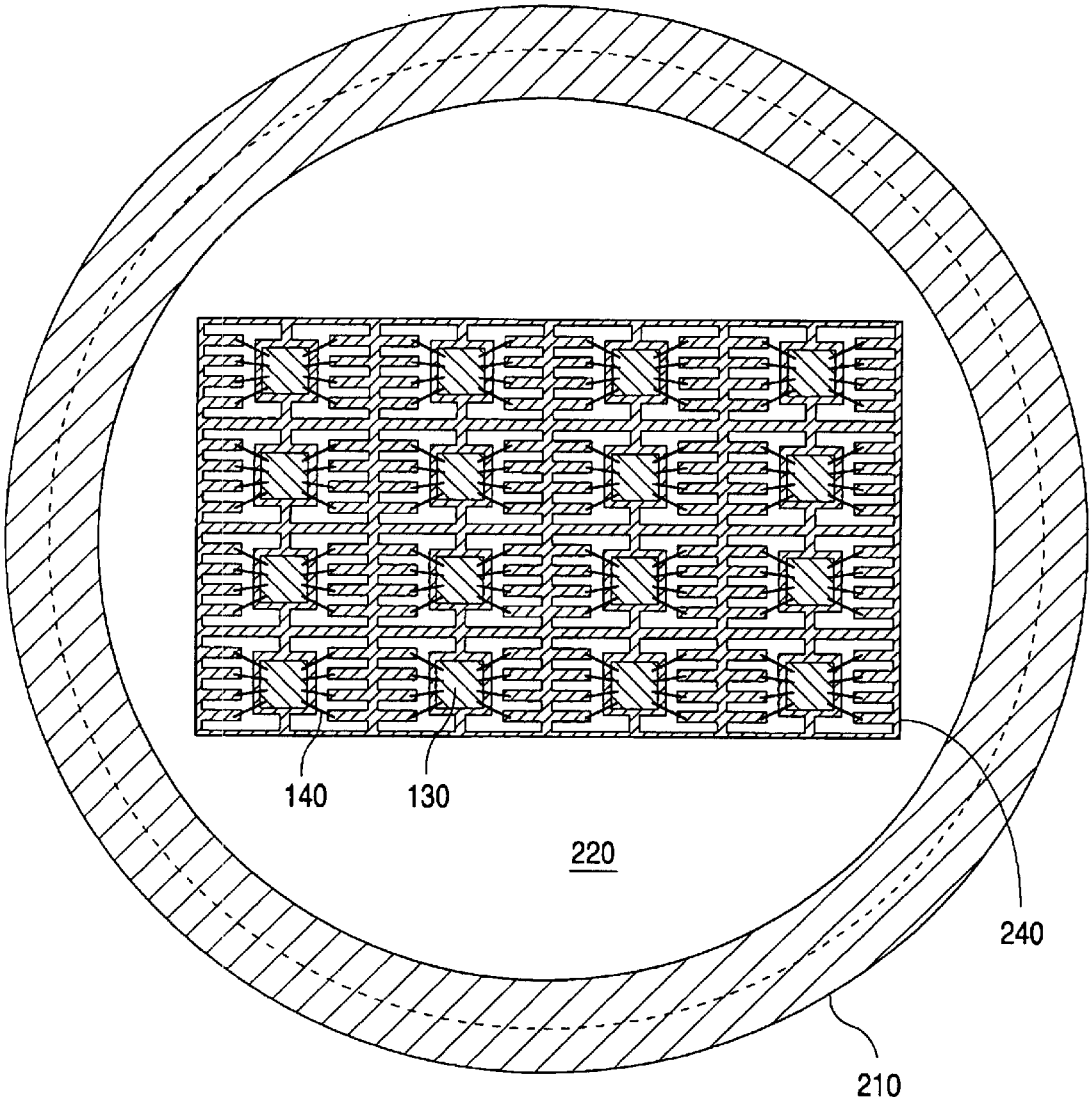
FIG. 2b (Amended)

LEAD FRAME CHIP SCALE PACKAGE

Matter enclosed in heavy brackets [ ] appears in the original patent but forms no part of this reissue specification; matter printed in italics indicates the additions made by reissue.

BACKGROUND INFORMATION

1. Field of the Invention

The present invention relates to integrated circuit packages, and more specifically, to the production of a chip scale integrated circuit package using a lead frame.

2. Related Art

[An integrated circuit (IC) package encapsulates an IC chip, or die, in a protective casing and also provides power and signal distribution between the IC chip and an external printed circuit board (PCB). A common IC package uses a metal lead frame to provide the electrical paths for that distribution. For production purposes, a lead frame panel 110 made up of multiple lead frames 120 is etched or stamped from a thin sheet of metal, as shown in FIG. 1a. An IC chip 130 is then mounted and wire bonded to each lead frame 120, as shown in FIG. 1b. Wire bonding is typically performed using fine gold wires 140. Each IC chip 130 is then encapsulated in a protective casing 160, which can be produced by installing a preformed plastic or ceramic housing around each IC chip 130, or by dispensing and molding a layer of encapsulated material over all IC chips 130. Next, lead frames 120 are cut apart, or singulated, and multiple electrical interconnections are attached to the lead frame in order to produce individual IC packages 190, as shown in FIG. 1c. The electrical interconnections provide the electrical interface between IC package 190 and the external PCB, and can take a variety of forms. FIG. 1c depicts a lead frame ball grid array (BGA) IC package in which electrical interconnections are provided by solder balls 150 mounted on the bottom surface of lead frame 120. Other types of electrical interconnections can be seen in FIG. 1d, which shows examples of common IC packages using lead frames, including a small outline package (SOP) 191, a pin-through-hole (PTH) package 192, and a plastic leaded chip carrier (PLCC) 193.]

The use of a lead frame provides an inexpensive means for IC package manufacturing. Etching or stamping a sheet of thin metal to produce the desired lead frame patterns is a well-known manufacturing process, and is conducive to high-volume, low-cost production. In addition, the lead frame panel provides a support framework for the IC chips during IC package assembly. However, as IC chip device densities increase and IC package sizes decrease, the geometries used in the electrical communication paths between the IC chip and the PCB decrease. For example, a chip scale package requires that the protective casing be no more than 20% larger than the IC chip. As a result, the area available for the electrical paths provided by the lead frame is significantly reduced, demanding much finer geometry, the lead frame thickness must be reduced to a point where the lead frame panel rigidity would no longer be sufficient to provide the necessary support during the IC package assembly process. Also, the fragile lead frame patterns would be more susceptible to damage during the manufacturing process. As a result, chip scale IC packages must use more costly techniques such as tape automated bonding (TAB) or printed substrate backing.

*FIGS. 1d-1 through 1d-3 show examples of common IC packages using lead frames. FIG. 1d-1 shows a small outline package (SOP) 191. FIG. 1d-2 shows a pin-through hole (PTH) package 192. FIG. 1d-3 shows a plastic leaded chip carrier (PLCC) 193.*

According, it is desirable to provide an IC packaging method that allows the use of a lead frame in a chip scale package.

SUMMARY OF THE INVENTION

The present invention provides a method for producing chip scale IC packages using lead frames. A temporary support fixture provides support and stability to a thin lead frame panel having the fine geometries required for higher-density IC chip interfaces. An embodiment of the support fixture includes an adhesive pad made of one-sided sticky tape mounted to a rigid frame made of stainless steel, the rigid frame maintaining the adhesive pad in a fixed configuration providing a stable flat surface for support of the lead frame panel. Alternatively, the rigid frame and adhesive pad can be made of any materials compatible with the IC package manufacturing process and capable of supporting the lead frame panel through the manufacturing process. The adhesive pad can also be patterned to case the manufacturing process. The rigid frame can include positioning features to assist in the alignment of the lead frame and adhesive pad. If encapsulant material is to be dispensed over the lead frame panel, a containment dam can be formed around the lead frame after it is installed on the adhesive pad, to provide a boundary for encapsulant material flow.

Figure 1B:
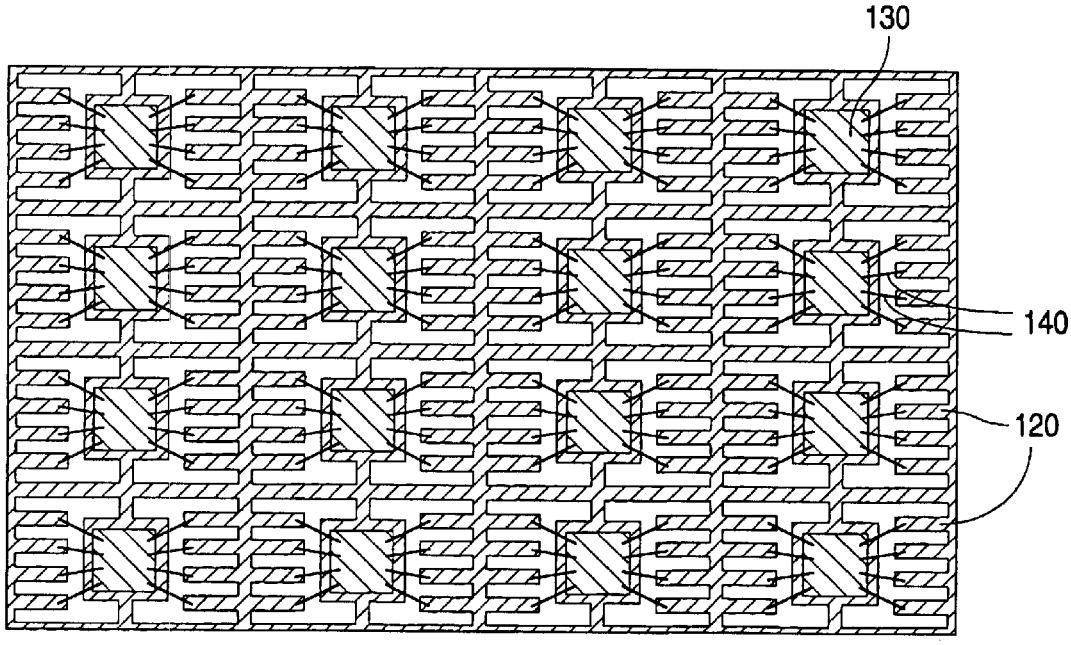
FIG. 1b shows [a] *the* lead frame panel *of FIG. 1a* populated with IC chips.
Figures 1, 1C:
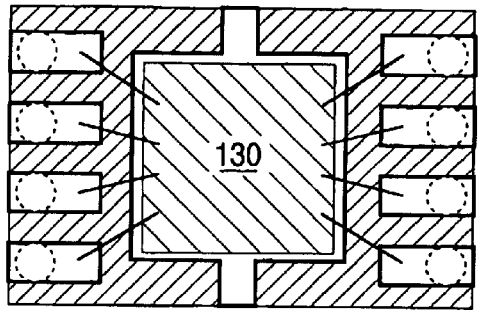
FIG. 1a shows a representation of a [typical] lead frame panel *in accordance with one embodiment of the present invention*.
Figures 1, 1C, 2:
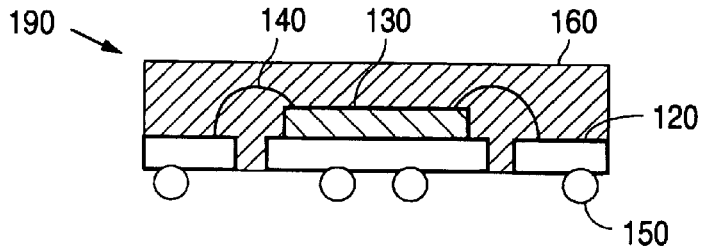
Figures 1, 1D:
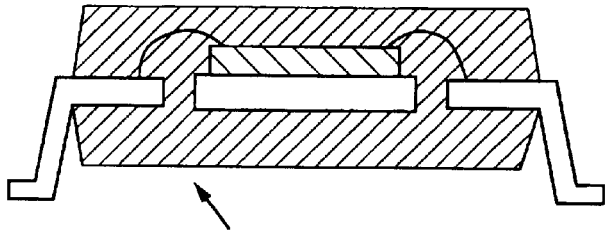
FIG. 1d-1 (PRIOR ART)
Figures 1, 1D, 2:
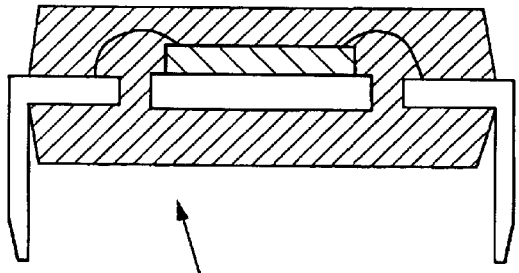
FIG. 1d-2 (PRIOR ART)
Figures 1, 1D, 2, 3:
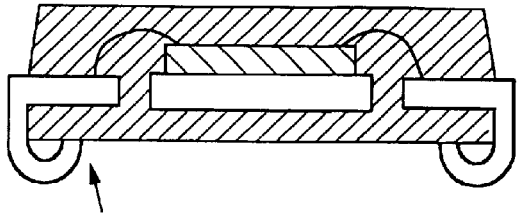
FIG. 1d-3 (PRIOR ART)
Figure 3A:
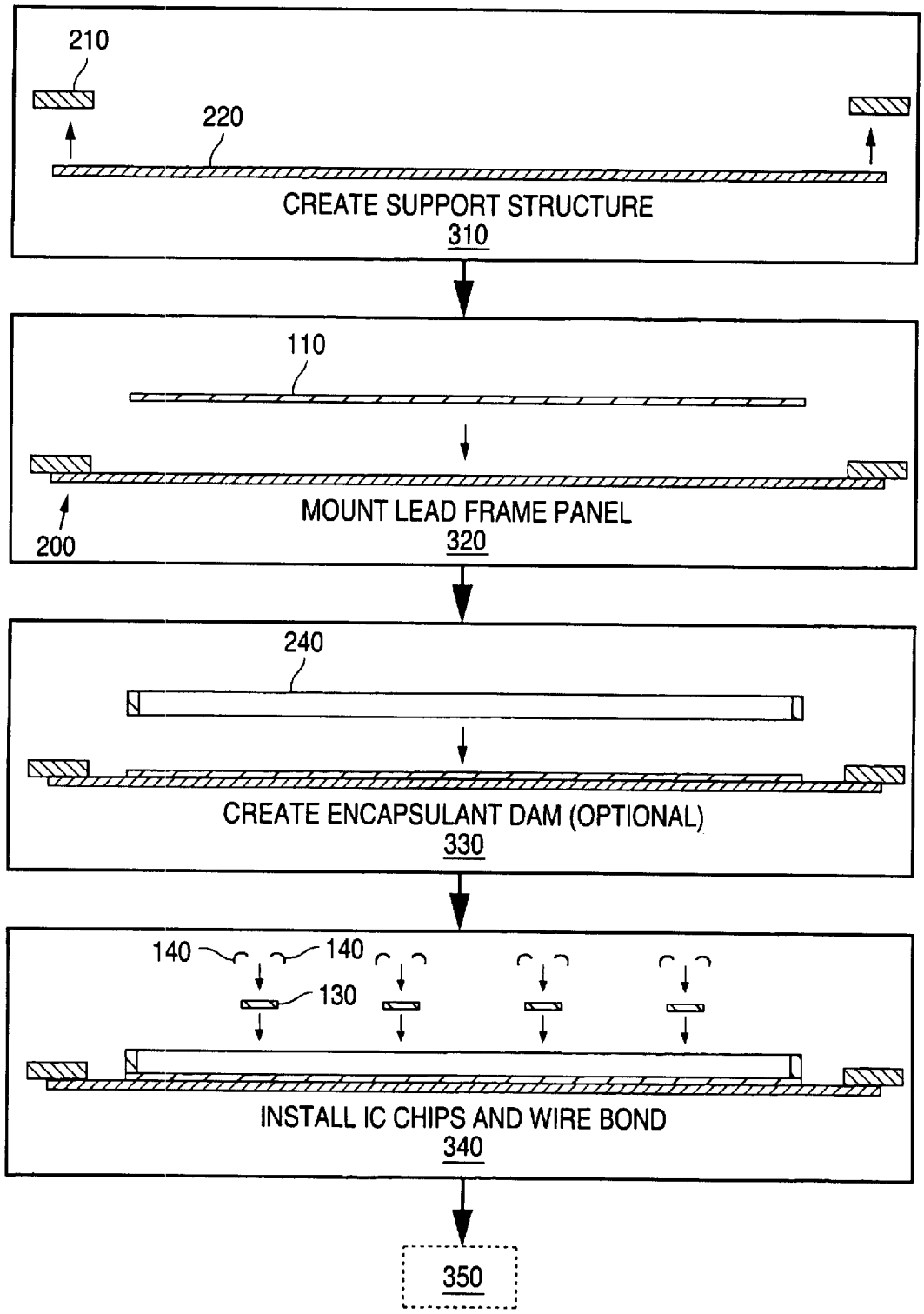
Figure 3B:
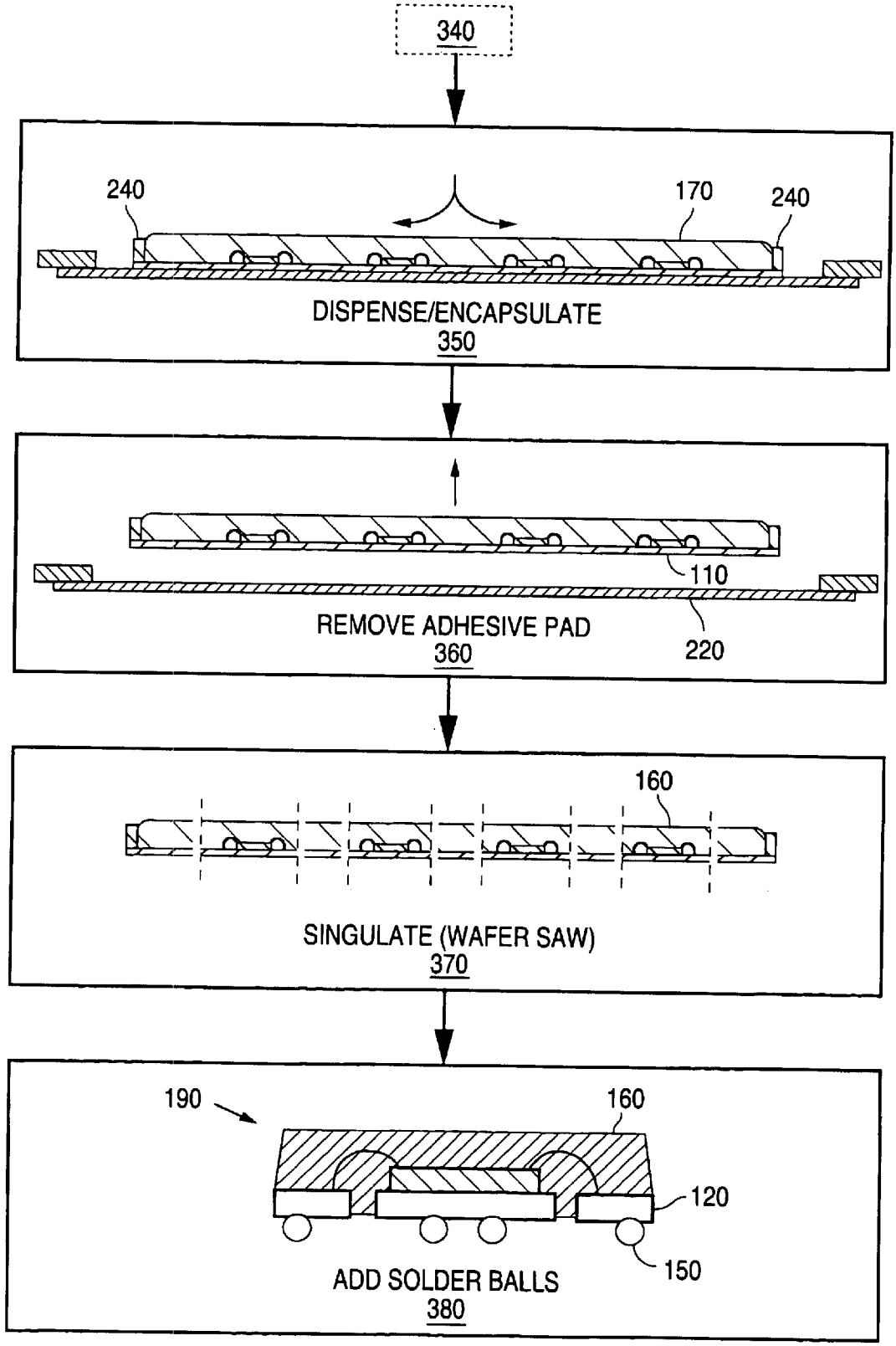

FIG*S*. 1c-*1 and 1c-2* show[s] *bottom and cross sectional views of* a signal leadframe BGA IC package;

FIG*S*. 1d-*1 through 1d-3* show[s] examples of common IC packages;

FIG. 2a shows an embodiment of a rigid support fixture;

FIG. 2b shows a lead frame panel mounted on an embodiment of a support fixture;

FIGS. 3a and 3b show a flow diagram of a manufacturing process using a temporary support fixture Use of the same reference number in different figures indicates similar or like elements.

DETAILED DESCRIPTION

*Generally, an integrated circuit (IC) package encapsulates an IC chip, or die, in a protective casing and also provides power and signal distribution between the IC chip and an external printed circuit board (PCB). A metal lead frame can be used to provide the electrical paths for that distribution. A lead frame panel suitable for use in accordance with the present invention is illustrated in FIG. 1a. For production purposes, a lead frame panel 110 made up of multiple lead frames 120 is etched or stamped from a thin sheet of metal, as shown in FIG. 1a. An IC chip 130 is then mounted and wire bonded to each lead frame 120, as shown in FIG. 1b. Wire bonding is typically performed using fine gold wires 140. Each IC chip 130 is then encapsulated in a protective casing 160 which may be formed by dispensing and molding a layer of encapsulant material over all IC chips 130. Next, lead frames 120 are cut apart, or singulated to produce individual IC packages 190.*

*As seen in FIG. 1a, the panel 110 includes a two dimensional array of device areas. Each device area has a plurality of contacts 112 and a die attach pad 114. The panel has a grid of tie bars 115 that extend in perpendicular rows and columns to define the device areas. The tie bars 115 carry the contacts 112 and die attach pads 114.*

The [present invention] *embodiment shown in FIG. 2a* employs a rigid support fixture during the manufacturing process to enable the use of lead frames in chip scale IC packages. An embodiment of a support fixture 200 includes a rigid frame 210 and an adhesive pad 220, as shown in the exploded isometric diagram of FIG. 2a. Because pad 220 is affixed along its border to frame 210, it maintains sufficient tension to provide a stable supporting surface for a lead frame panel 110. By making pad 220 out of a thin, flexible, and electrically non-conductive material, it provides a support structure that will not interfere with the conventional manufacturing processes used in IC package assembly. The size of the interior opening of frame 210 is large enough to allow lead frame panel 110 to be fully supported by pad 220. Multiple IC chips 130 are then installed and wire bonded on lead frame panel 110, as shown in FIG. 2b. Subsequent encapsulation of IC chips 130 in protective casings proceeds as in conventional lead frame processing. If a molded protective casing is to be applied, an encapsulant dam 240 can be constructed around the perimeter of lead frame panel 110. Dam 240 can be made of any substantially rigid substances, including premolded plastic, epoxy, or tape, and serves to prevent flow of encapsulant material beyond the boundaries of lead frame panel 110. Alternatively, containing measures for encapsulant material could be incorporated into the dispensing mechanism. Once encapsulation is complete, support fixture 200 can be removed, either before or after singulation.

The embodiment of the present invention shown in FIGS. 2a and 2b can be constructed from common and readily available materials. Pad 220 can be made from a 3M or Nitto-brand sticky tape used in conventional wafer saw operations. Likewise, a stainless steel ring of the type used in conventional wafer saw operations can be employed for frame 210. However, both pad 220 and frame 210 can be implemented in many different ways as well. For example, frame 210 can be constructed from any rigid material compatible with the IC package assembly process, such as copper, aluminum, or even non-metals such as ceramic or plastic. Also, while depicted as a thin circular element, frame 210 can also take a variety of configurations depending on handling, interface, and user requirements. For instance, frame 210 can include positioning features to ensure consistent alignment for lead frame panel 110 and adhesive pad 220. A circular outline for frame 210 provides compatibility with conventional handling requirements for IC production, but is not required aspect of the present invention.

Similarly, numerous implementations of adhesive pad 220 are possible. Any material compatible with the IC package assembly process and capable of providing the necessary support to the lead frame panel and IC chips can be used. The sticky tape mentioned previously is a convenient choice due to widespread current usage and availability. The use of one-sided sticky tape enables pad 220 to be applied to the bottom surface of frame 210 and provide an adhesive surface for mounting of lead frame panel 110, without requiring additional attachment materials or components. Pad 220 can also be patterned by removing selected portions in order to facilitate subsequent assembly operations such as electrical interconnection formation. Removal of pad 220 once packaging is complete can be performed in various ways, depending on the nature of the adhesive material used. A light adhesive material may allow pad 220 to simply be peeled away from frame 110. An alternative bonding agent requires exposure to UV light before removal of pad 220 can take place.

FIGS. 3a and 3b show a graphical flow chart illustrating a method for manufacturing a lead frame BGA package using an embodiment of the present invention. The manufacturing process is described in conjunction with the elements described in FIGS. 2a–2c. In a step 310 in FIG. 3a, adhesive pad 220 is applied to rigid frame 210 to create support fixture 200. Lead frame panel 110 is then mounted on pad 220 in a step 320. An optical step 330 allows encapsulant dam 240 to be applied around the border of lead frame panel 110 if subsequent encapsulant material dispensing is to be performed. Next, an IC chip 130 is mounted and wire bonded onto each of the lead frames 120 of lead frame panel 110. Continuing the process in FIG. 3b, a step 350 involves dispensing a portion of encapsulant material 170 into the area defined by dam 240 to cover IC chips 130, and then curing material 170 to a desired hardness. In a step 360, pad 220 is removed from lead frame panel 110. Next, in a step 370, a wafer saw operation is performed to singulate lead frame panel 110 into individual IC packages. The singulation process converts the layer of hardened encapsulant material 170 into individual protective casings 160. Finally, in a step 380, solder balls 150 are applied to desired electrical interconnection locations to complete lead frame BGA IC package 190.

In this manner a lead frame BGA IC package can be produced using a temporary support structure. This enables the production of IC packages using lead frames that would otherwise be too fragile to withstand conventional manufacturing processes. It should be noted that while particular embodiments of the present invention have been shown and described, it will be apparent to those skilled in the art that many modifications and variations thereto are possible, all of which fall within the true spirit and scope of the invention. For example, the wafer saw operation of step 370 can be performed prior to removal of support fixture 200 from lead frame panel 110. Also, solder balls 150 could be applied to lead frames 120 in step 370 prior to singulation. Alternatively, appropriately located openings in adhesive pad 220 would allow solder balls 150 to be applied without removing pad 220. Certain lead frame designs may even allow patterning of pad 220 such that removal is unnecessary. Finally, while the present invention has been described with reference to chip scale IC package manufacturing, it can be applied to any IC package manufacturing process involving lead frames, including non-chip scale and non-BGA IC packages such as SOP's, PLCC's, and PTH packages.

We claim:

1. A fixture for providing temporary support to a lead frame during an IC package manufacturing process comprising an adhesive pad attached to a rigid frame, said rigid frame having an opening larger than said lead frame so as to accommodate said lead frame entirely within an outer periphery of said rigid frame, and such that said adhesive pad is held in tension by said rigid frame to provide a stable support surface for said lead frame.

2. The fixture of claim 1 wherein said adhesive pad is constructed of single-sided sticky tape.

3. A fixture for providing temporary support to a lead frame during an IC package manufacturing process comprising an adhesive pad attached to a rigid frame such that said adhesive pad is held in tension by said rigid frame to provide a stable support surface for said lead frame, wherein said rigid frame comprises a stainless steel ring having an opening of a diameter larger than said lead frame.

4. The fixture of claim 1 wherein said rigid frame includes a set of positioning features for positioning and aligning said lead frame and said adhesive pad with respect to said rigid frame.

5. The fixture of claim 1 wherein said adhesive pad is patterned to facilitate a subsequent manufacturing step.

6. A fixture as in claim 1, wherein said lead frame includes multiple die attach pads for accommodating multiple integrated circuit dies.

7. A fixture as in claim 1, further comprises an encapsulation dam having an outer wall adapted for enclosing said lead frame.

8. A fixture as in claim 1, wherein each die attach pad is provided around its periphery multiple leads for wire-bonding.

*9. A fixture as recited in claim 1, wherein the rigid frame is formed from stainless steel.*

* * * * *